United States Patent

Ferrer et al.

(10) Patent No.: US 11,221,203 B1
(45) Date of Patent: Jan. 11, 2022

(54) MAGNETIC FIELD SENSOR WITH FAULT REPORTING

(71) Applicant: Allegro MicroSystems, LLC, Manchester, NH (US)

(72) Inventors: Florencia Ferrer, Montevideo (UY); Jesse Lapomardo, Pembroke, NH (US); Lautaro Casella, Buenos Aires (AR); Lucas Intile, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 16 days.

(21) Appl. No.: 17/009,072

(22) Filed: Sep. 1, 2020

(51) Int. Cl.
*G01B 7/30* (2006.01)
*G01D 5/14* (2006.01)

(52) U.S. Cl.
CPC .............. *G01B 7/30* (2013.01); *G01D 5/145* (2013.01)

(58) Field of Classification Search
CPC .................................. G01B 7/30; G01D 5/145
See application file for complete search history.

(56) References Cited

U.S. PATENT DOCUMENTS

| | | | |
|---|---|---|---|
| 8,754,640 B2 | 6/2014 | Vig et al. | |
| 9,470,506 B2 * | 10/2016 | Schaffer | G01R 33/0035 |
| 9,664,748 B2 * | 5/2017 | Friedrich | G01P 13/045 |
| 9,759,737 B2 * | 9/2017 | Dunbar | G01D 5/2451 |
| 10,216,559 B2 | 2/2019 | Fernandez | |
| 10,310,028 B2 * | 6/2019 | Latham | G01L 13/025 |
| 10,436,606 B2 | 10/2019 | Kerdraon et al. | |
| 10,473,486 B2 | 11/2019 | Doogue et al. | |
| 10,480,957 B2 | 11/2019 | Kerdraon et al. | |
| 10,571,301 B2 | 2/2020 | Doogue et al. | |
| 10,598,514 B2 | 3/2020 | Pepka et al. | |
| 10,656,170 B2 | 5/2020 | Lim et al. | |
| 10,725,122 B2 | 7/2020 | Rubinsztain et al. | |

OTHER PUBLICATIONS

U.S. Appl. No. 16/788,505, filed Feb. 12, 2020, Scheller et al.
Allegro MicroSystems, LLC, "Programmable Linear Hall IC with Advanced Diagnostics for Safety-Critical Applications;" Data Sheet A1342, Rev. 2; Jan. 25, 2019; 48 Pages.

* cited by examiner

*Primary Examiner* — Reena Aurora
(74) *Attorney, Agent, or Firm* — Daly, Crowley, Mofford & Durkee, LLP

(57) ABSTRACT

In one aspect, a magnetic field sensor includes a magnetic field sensing element configured to detect changes in a magnetic field caused by a target and an encoder configured to process signals originating from the magnetic field element. The encoder is configured to generate a first output signal and a second output signal. In a non-fault state, the first and second output signals are 90 electrical degrees out of phase from one another, and in a fault state, the first and second output signals are in phase with each other.

20 Claims, 5 Drawing Sheets

| State | Signal A | Signal B |
|---|---|---|
| Q1 | 0 | 0 |
| Q2 | 0 | 1 |
| Q3 | 1 | 1 |
| Q4 | 1 | 0 |

MAGNETIC FIELD SENSOR WITH FAULT REPORTING

BACKGROUND

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

SUMMARY

In one aspect, a magnetic field sensor includes a magnetic field sensing element configured to detect changes in a magnetic field caused by a target and an encoder configured to process signals originating from the magnetic field element. The encoder is configured to generate a first output signal and a second output signal. In a non-fault state, the first and second output signals are 90 electrical degrees out of phase from one another, and in a fault state, the first and second output signals are in phase with each other.

In another aspect, an angle sensor includes a magnetic field sensing element configured to detect changes in a magnetic field caused by a target; an incremental encoder configured to process signals originating from the magnetic field element; and a pulse width modulation (PWM) processor producing a PWM output. The incremental encoder is configured to generate a first output signal, a second output signal and a third output signal. The PWM output indicates a fault when a frequency of the PWM output is reduced. In a non-fault state, the first and second output signals are 90 electrical degrees out of phase from one another; and, in a fault state, the first and second output signals are in phase with each other and the third output has a high impedance, or the first, second and third outputs have a high impedance.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 1C is an example of quadrature states for the magnetic field sensor of FIG. 1A;

DETAILED DESCRIPTION

Figure 1A:
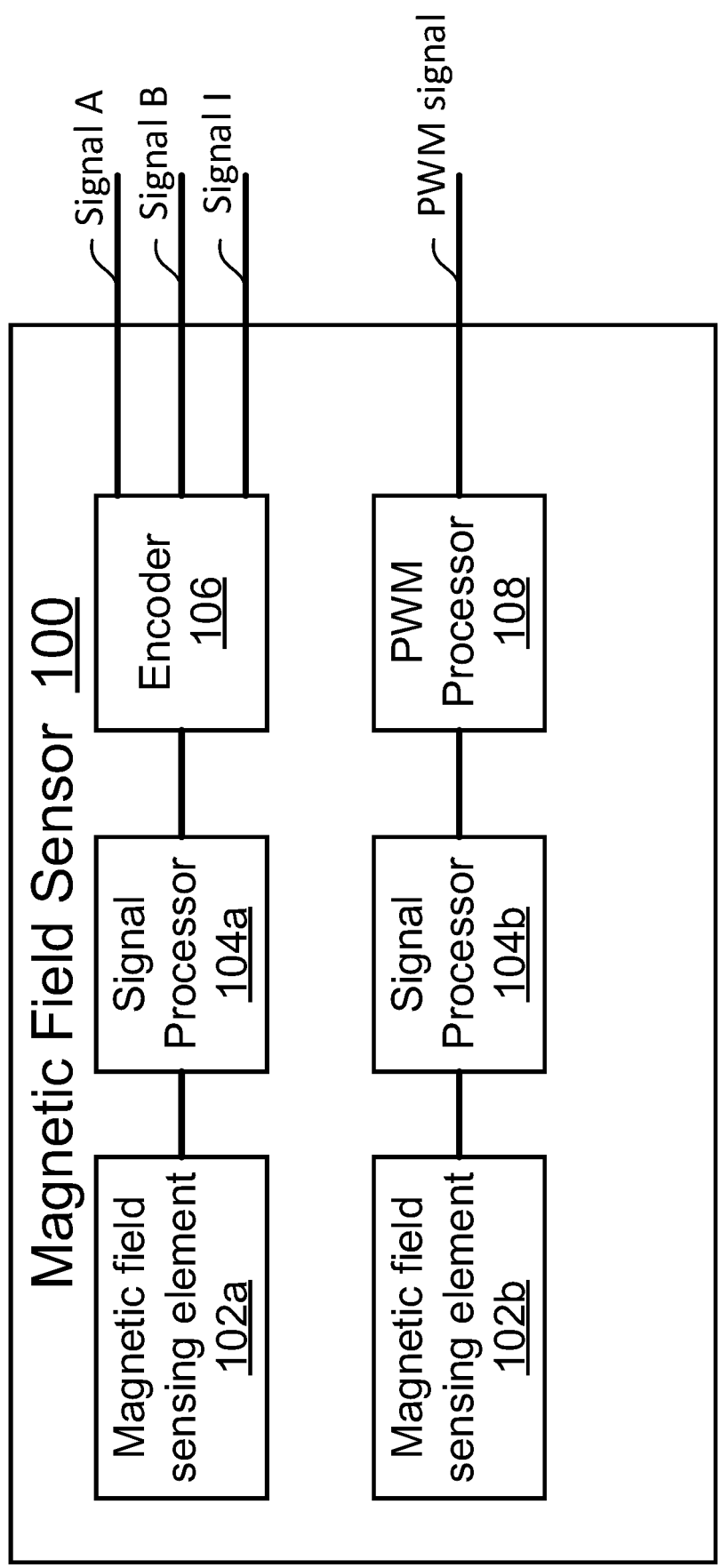
FIG. 1A is a block diagram of an example of a magnetic field sensor.

The effects of data corruption in transmission lines may have fatal consequences for critical applications. In some critical systems, it is mandatory that there is the capability of exchanging reliable data and signaling failures. For example, in the automotive industry, functional safety using electric or electronic equipment is stated in industry standards (e.g., ISO 26262 Road vehicles—Functional safety). Described herein are techniques to report data and faults from a magnetic field sensor.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, and a vertical Hall element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Referring to FIG. 1A, a magnetic field sensor includes a magnetic field sensing element 102a, a signal processor 104a and an encoder 106. In one example, the encoder 106 is an incremental encoder.

The magnetic field sensor 100 also includes a magnetic field sensing element 102b, a signal processor 104b and a pulse width modulation (PWM) processor 108. In one example, the magnetic field sensor 100 is an angle sensor.

The encoder 106 may provide at least three output signals (e.g., a signal A, a signal B, and a signal I). The PWM processor 108 may provide at least one output signal (e.g., a PWM signal).

In one example, the signals A and B are 50% duty cycle pulses (relative to angular distance) with a defined phase relationship. For example, the signal B is offset from the signal A by one quarter of the cycle period. At a frequency of $2^N$ cycles per magnetic revolution, a cycle resolution is $360/2^N$ degrees per cycle, where N is the cycle resolution in bits. The duration of one cycle is referred to as 360 electrical degrees (or 360e). One half of a cycle is 180e and a quarter of a cycle (one quadrature state, or R degrees) is 90e.

Figure 1B:
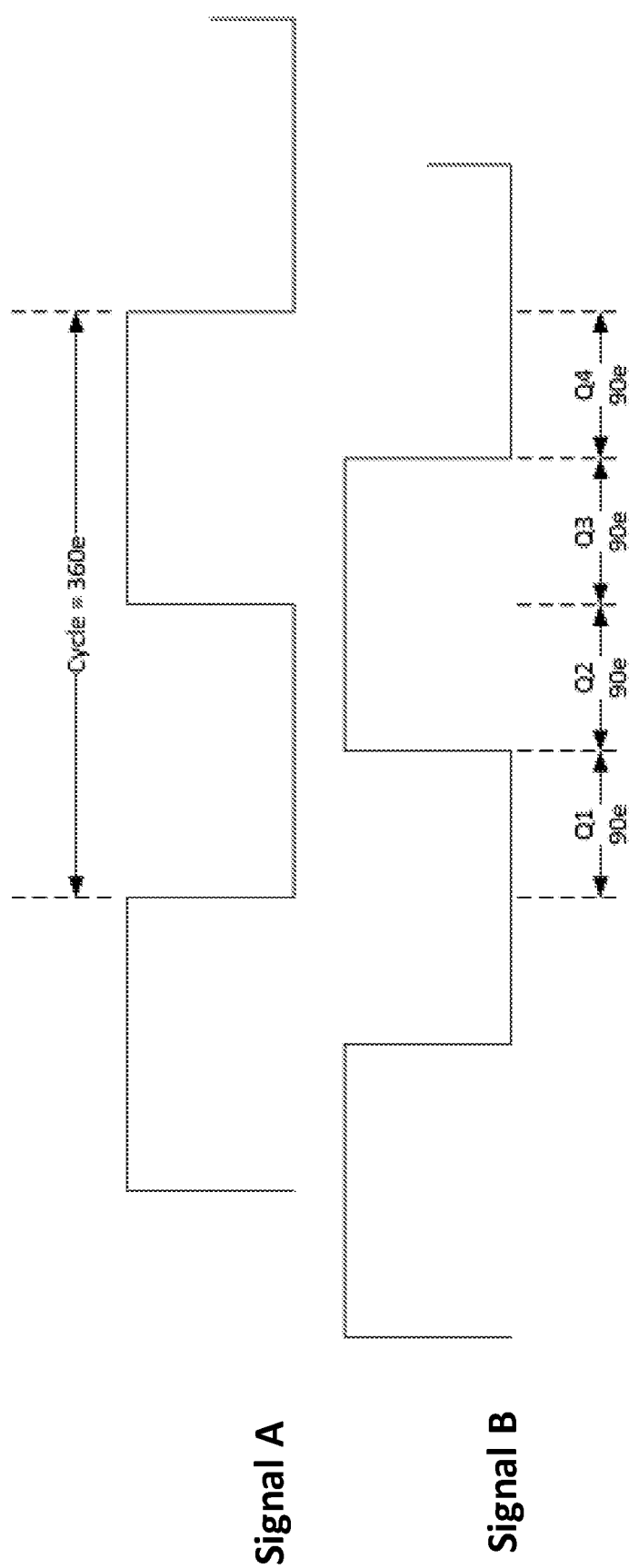
FIG. 1B is an example of output signals from the magnetic field sensor of FIG. 1A.

Signals A and B may be used to indicate a rotational direction of a magnetic field. In one example, if the signal A leads the signal by 90 electrical degrees, then the magnetic field is rotating clockwise (CW); and if the signal B leads the signal A by 90 electrical degrees as shown in FIG. 1B, then the magnetic field is rotating counterclockwise (CCW). In another example, the opposite may be true. That is, if the signal A leads the signal by 90 electrical degrees, then the magnetic field is rotating CCW; and if the signal B leads the signal A by 90 electrical degrees, then the magnetic field is rotating CW.

Since signals A and B are offset by ¼ of a cycle, they are in quadrature and together have 4 unique states per cycle (or counts). Each state represents R degrees of the full revolution:

$$R = \frac{360°}{4*2^N}$$

where N is the cycle resolution in bits.

This angular distance is the quadrature resolution (R) of the encoder 106. The direction of rotation is determined by the order in which the states change (the order of the edge transitions from signal A to signal B). If a given signal B edge (rising/falling) precedes the following signal A edge, the angle is increasing from the perspective of the electrical angle and the angle position is incremented by the quadrature resolution R at each state transition. Conversely, if a given signal A edge precedes the following signal B edge, the angle is decreasing from the perspective of the electrical angle and the angle position is decremented by the quadrature resolution R at each state transition.

As shown in FIG. 1C, quadrature states are designated as Q1, Q2, Q3 and Q4. In the Q1 state, signals A and B are "0" or low. In the Q2 state, signal A is "0" or low and signal B is "1" or high. In the Q3 state, signals A and B are "1" or high. In the Q4 state, signal B is "0" or low and signal A is "1" or high.

For an increasing angle, the state progression is Q1 to Q2 to Q3 to Q4 to Q1 and so forth. For a decreasing angle, the state progression is Q4 to Q3 to Q2 to Q1 to Q4 and so forth.

In one example, in a fault state, the signals A and B are in phase with each other. In one example, in a fault state, the signals A and B are in phase with each other at a fixed frequency. In another example, the signals A and B are in phase with each other at a fixed frequency with a fixed duty cycle. In another particular example, in the fault state, the signals A and B are in phase with each other at a fixed frequency for a fixed period (e.g., 2 PWM frames). In a further example, in a fault state, the signal I is set to a high impedance. In other examples, any combination thereof may be used to indicate a fault.

The PWM processor 108 has several mechanisms to indicate a fault. In one example, the PWM processor 108 may change the PWM signal to output a high impedance signal to indicate a fault.

In another example, the frequency of the PWM signal may be reduced by the PWM processor 108 to a predetermined value to indicate a fault. In one particular example, the frequency of the PWM signal may be reduced by 50% to indicate a fault.

In other examples, the duty cycle of the PWM signal may be set to a predetermined value to indicate a fault. In other examples, the PWM processor 108 may indicate a fault by changing the PWM signal to output a high impedance signal, or reducing the frequency of the PWM signal and changing the duty cycle of the PWM signal to a predetermined value or any combination thereof.

A fault may include one or more of: a supply voltage under voltage condition, a voltage check failure, a supply voltage over voltage condition, a temperature sensor error, a magnet sense high, a saturation current, a magnet sense low, a signal path mismatch condition, a memory (e.g., EEPROM) single bit error condition, an error of the encoder 106 output signal (signal A, signal B and/or signal I), a slew rate warning, an count up by encoder 106 completed, oscillator frequency error, memory (e.g., EEPROM) double bit error condition and/or shadow memory error.

Figure 2:
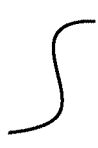
FIG. 2 is a table with examples of duty cycle values that may be used to indicate different types of faults.

Referring to FIG. 2, a table 200 is an example of duty cycle values 202b of the PWM signal and their corresponding faults 202a. A duty cycle of 38.75 may indicate a supply voltage under voltage condition (UVCC). A duty cycle of 33.13 may indicate a voltage check failure (VCF). A duty cycle of 72.50 may indicate a supply voltage over voltage condition (OVCC). A duty cycle of 66.88 may indicate a temperature sensor error (TSE). A duty cycle of 61.25 may indicate a magnet sense high (MSH). A duty cycle of 56.63 may indicate a saturation condition (SAT). A duty cycle of 44.38 may indicate a magnet sense low (MSL). A duty cycle of 21.88 may indicate a signal path mismatch condition (SMM). A duty cycle of 27.5 may indicate an error of the encoder 106 output signal (ABI) or a slew rate warning (SLR). A duty cycle of 78.05 may indicate that a memory (e.g., EEPROM) has a single bit error condition (ESE+POR). A duty cycle of 84 indicates that a count-up of the encoder 106 is complete (ACD).

In other examples, the oscillator frequency error, the memory double bit error condition and the shadow memory error may be indicated by forcing the PWM signal to a high impedance state that may only be cleared by a reset.

In one example, any fault state is reported for at least two PWM frames. In one example, if the fault is cleared after two frames the magnetic field sensor 100 generates outputs as it would in a normal state (e.g., providing angle data).

Referring back to FIG. 1, after a fault has been cleared the encoder 106 may begin increasing from 0°. In some examples, to reduce the amount of time in the counting up process, the encoder 106 may increment in a clockwise direction or a counterclockwise direction, whichever may be the shortest time to achieve the current angle position before the fault. For example, if the current angle position is 270°, the encoder 106 may increment in the counterclockwise direction counting down from 360° toward 270°.

Figure 3:
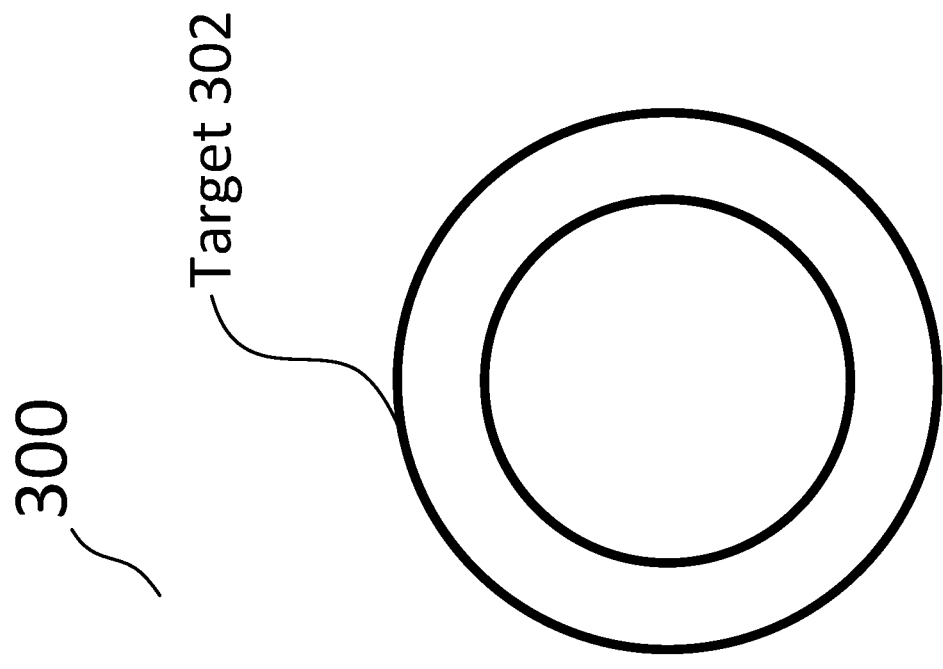
FIG. 3 is a diagram of an example of a system that the magnetic field sensor of FIG. 1A may be used.

Referring to FIG. 3, a system 300 includes a magnetic field sensor 100' and a target 302. In one example, the magnetic field sensor 100' is substantially the same as the magnetic field sensor 100. In some examples, the target 302 may include magnetic domains of a ring magnet or the target 302 may be a ferromagnetic target (e.g., with gear teeth). In some examples, in a normal state, the magnetic field sensor 100' may be used to detect the angular position of the target 302. In other examples, in a fault state, the magnetic field sensor 100' reports faults as described herein with respect to the magnetic field sensor 100.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor comprising:
   a magnetic field sensing element configured to detect changes in a magnetic field caused by a target; and
   an encoder configured to process signals originating from the magnetic field element, wherein the encoder is configured to generate a first output signal and a second output signal,
   wherein in a non-fault state the first and second output signals are 90 electrical degrees out of phase from one another,
   wherein in a fault state, the first and second output signals are in phase with each other.

2. The magnetic field sensor of claim 1, wherein, in the fault state, the first and second output signals are in phase with each other comprises the first and second output signals are in phase with each other at a fixed frequency.

3. The magnetic field sensor of claim 2, wherein, in the fault state, the first and second output signals are in phase with each other at a fixed frequency comprises the first and second output signals are in phase with each other at a fixed frequency for a fixed period.

4. The magnetic field sensor of claim 1, further comprising a pulse width modulation (PWM) processor producing a PWM output,
   wherein the PWM output indicates a fault when a frequency of the PWM output is reduced.

5. The magnetic field sensor of claim 4, wherein the PWM output indicates the fault when the frequency of the PWM output is reduced comprises the PWM output indicates the fault when the frequency of the PWM output is reduced by at least 50%.

6. The magnetic field sensor of claim 4, wherein the PWM output indicates the fault when the frequency of the PWM output is reduced comprises the PWM output indicates the fault when the frequency of the PWM output is reduced and the duty cycle of the PWM output is set to a predetermined value.

7. The magnetic field sensor of claim 6, wherein the predetermined value indicates a type of fault.

8. The magnetic field sensor of claim 7, wherein the type of fault indicates one of a supply voltage under voltage condition, a voltage check failure, the supply voltage over voltage condition, a temperature sensor error, a magnet sensor high, a saturation condition, a magnet sense low, a signal path mismatch condition, a single bit memory error condition, an encoder error, a slew rate warning, an encoder count-up is complete, an oscillator frequency error, a double bit memory error condition or a shadow memory error.

9. The magnetic field sensor of claim 4, wherein, in the fault state, the first and second output signals are in phase with each other comprises the first and second output signals are in phase with each other at a fixed frequency for two PWM frames.

10. The magnetic field sensor of claim 1, wherein the encoder is further configured to generate a third output signal,
    wherein, in the fault state, the third output signal has a high impedance and/or is a logical high.

11. The magnetic field sensor of claim 1, wherein the encoder is an incremental encoder.

12. The magnetic field sensor of claim 1, wherein the magnetic field sensor is an angle sensor.

13. An angle sensor comprising:
    a magnetic field sensing element configured to detect changes in a magnetic field caused by a target;
    an incremental encoder configured to process signals originating from the magnetic field element, wherein the incremental encoder is configured to generate a first output signal, a second output signal and a third output signal; and
    a pulse width modulation (PWM) processor producing a PWM output, wherein the PWM output indicates a fault when a frequency of the PWM output is reduced,
    wherein, in a non-fault state, the first and second output signals are 90 degrees out of phase from one another,
    wherein, in a fault state:
       the first and second output signals are in phase with each other and the third output has a high impedance, or
       the first, second and third outputs have a high impedance.

14. The angle sensor of claim 13, wherein, in the fault state, the first and second output signals are in phase with each other at a fixed frequency for a fixed period.

15. The angle sensor of claim 14, wherein the fixed period is equal to two PWM frames.

16. The angle sensor of claim 13, wherein the PWM output indicates a fault when a frequency of the PWM output is reduced.

17. The angle sensor of claim 16, wherein the PWM output indicates the fault when the frequency of the PWM output is reduced comprises the PWM output indicates the fault when the frequency of the PWM output is reduced by at least 50%.

18. The angle sensor of claim 13, wherein the PWM output indicates the fault when the frequency of the PWM output is reduced comprises the PWM output indicates the fault when the frequency of the PWM output is reduced and the duty cycle of the PWM output is set to a predetermined value.

19. The angle sensor of claim 18, wherein the predetermined value indicates a type of fault.

20. The angle sensor of claim 19, wherein the type of fault indicates one of a supply voltage under voltage condition, a voltage check failure, the supply voltage over voltage condition, a temperature sensor error, a magnet sensor high, a saturation condition, a magnet sense low, a signal path mismatch condition, a single bit memory error condition, an encoder error, a slew rate warning, a count-up complete, an oscillator frequency error, a double bit memory error condition or a shadow memory error.

* * * * *

UNITED STATES PATENT AND TRADEMARK OFFICE
CERTIFICATE OF CORRECTION

| | | |
|---|---|---|
| PATENT NO. | : 11,221,203 B1 | Page 1 of 1 |
| APPLICATION NO. | : 17/009072 | |
| DATED | : January 11, 2022 | |
| INVENTOR(S) | : Florencia Ferrer et al. | |

It is certified that error appears in the above-identified patent and that said Letters Patent is hereby corrected as shown below:

In the Specification

Column 2, Line 60 delete "sensor" and replace with --sensor 100--.

Column 3, Line 16 delete "signal by" and replace with --signal B by--.

Column 3, Line 21 delete "signal by" and replace with --signal B by--.

Column 4, Line 24 delete ", an count" and replace with --, a count--.

Signed and Sealed this
Twenty-fourth Day of January, 2023

Katherine Kelly Vidal
*Director of the United States Patent and Trademark Office*